US006933869B1

(12) United States Patent
Starr et al.

(10) Patent No.: US 6,933,869 B1
(45) Date of Patent: Aug. 23, 2005

(54) INTEGRATED CIRCUITS WITH TEMPERATURE-CHANGE AND THRESHOLD-VOLTAGE DRIFT COMPENSATION

(75) Inventors: Greg Starr, San Jose, CA (US); Samit Sengupta, San Jose, CA (US); Hugh SungKi O, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/802,590

(22) Filed: Mar. 17, 2004

(51) Int. Cl.$^7$ .............................................. H03M 1/10
(52) U.S. Cl. ...................................... 341/120; 341/144
(58) Field of Search ........................ 341/120, 118, 119, 341/121, 122, 144, 155; 365/149, 189.07, 365/190, 205, 207, 208

(56) References Cited

U.S. PATENT DOCUMENTS

| 4,858,195 | A | * | 8/1989 | Soneda ........................ 365/205 |
| 5,859,794 | A | * | 1/1999 | Chan .......................... 365/149 |
| 6,028,803 | A | * | 2/2000 | Kopley et al. .............. 365/208 |
| 6,195,295 | B1 | * | 2/2001 | McPartland ............ 365/189.05 |
| 6,462,986 | B1 | * | 10/2002 | Khan ...................... 365/185.2 |

OTHER PUBLICATIONS

John G. Maneatis "Low-Jitter Process-Independent DLL and PLL Based on Self-Biased Techniques", IEEE Journal of Solid-State Circuits, vol. 31, No. 11 (Nov. 1996) pp. 1723-1732.
Paul R. Gray et al. "Analysis and Design of Analog Integrated Circuits", John Wiley & Sons, Inc. 1993, p. 329, no month.

* cited by examiner

Primary Examiner—Brian Young
(74) Attorney, Agent, or Firm—G. Victor Treyz

(57) ABSTRACT

Integrated circuits are stabilized by monitoring changes that affect circuit operation and by compensating for those changes using power supply adjustments. Changes in operating temperature and threshold voltage changes may be measured. Differential measurements may be made in which threshold voltages measured in continuously-biased monitoring circuits are compared to threshold voltages measured in intermittently-biased monitoring circuits. Temperature changes may be monitored using a temperature monitoring circuit based on an adjustable current source and a diode. Monitoring and compensation circuitry on the integrated circuits may use analog-to-digital and digital-to-analog converters controlled by a control unit to make temperature and threshold voltage measurements and corresponding compensating changes in power supply voltages.

20 Claims, 13 Drawing Sheets

INTEGRATED CIRCUITS WITH TEMPERATURE-CHANGE AND THRESHOLD-VOLTAGE DRIFT COMPENSATION

BACKGROUND OF THE INVENTION

This invention relates to integrated circuits, and more particularly, to ways in which to improve circuit performance by compensating for the effects of metal-oxide-semiconductor (MOS) transistor threshold voltage drift and temperature changes.

Integrated circuits based on complementary metal-oxide-semiconductor (CMOS) transistor technology are widely used in modern electronic systems. The proper performance of CMOS integrated circuits is often critically dependent on the stable operation of its MOS transistors. Even relatively small changes in transistor performance can have a strong impact on the operation of sensitive circuitry on a high-performance CMOS chip.

The operation of a transistor can be significantly affected by variations in temperature and changes in the transistor's threshold voltage due to aging. If a transistor's threshold voltage increases even slightly, the transistor's ability to drive current may be reduced sufficiently that a sensitive digital logic circuit in which the transistor is operating will slow down substantially or no longer function properly and the gain of certain sensitive analog circuits may be degraded. This can disrupt the proper functioning of the entire integrated circuit.

CMOS integrated circuits contain p-channel (PMOS) and n-channel (NMOS) transistors. The threshold voltage of a PMOS transistor can change over time due to negative bias temperature instability (NBTI). Negative bias temperature instability arises when MOS devices are exposed to low gate bias voltages under elevated operating temperatures. Threshold voltage increases due to NBTI may be significant—i.e., on the order of tens of millivolts over the lifetime of a circuit. The threshold voltages in NMOS transistors may also increase over time due to the accumulation of gate-oxide charge from hot carrier effects.

It is an object of the present invention to provide ways in which to overcome variations in transistor performance due to changes in operating temperature and shifts in threshold voltages.

SUMMARY OF THE INVENTION

In accordance with the present invention, integrated circuits are provided with monitoring and compensation circuitry for measuring changes in temperature and transistor threshold voltages that may affect circuit performance. Power supply adjustments may be made by the monitoring and compensation circuitry to compensate for the effects of the measured changes. For example, the monitoring and compensation circuitry can boost the power supply voltage to sensitive circuits whenever temperatures rise or threshold voltages increase. The increase in power supply voltage can reduce or eliminate the negative impact of changes in temperature and threshold voltage.

Measurements of changes in threshold voltage may be made by comparing the measured threshold voltage of a continuously-biased transistor circuit to the measured threshold voltage of an intermittently-biased transistor circuit. Because the intermittently-biased transistor circuit is not exposed to bias signals, the threshold voltage of this transistor will be relatively stable and can be used as an on-circuit baseline measurement. The continuously-biased transistor circuit will exhibit significant threshold voltage drift. Accurate measurements of threshold voltage changes can be made using a differential measurement scheme in which the baseline measurements from the intermittently-biased circuit are subtracted from the threshold voltage measurements made on the continuously-biased circuit.

Measurements of changes in temperature may be made using a temperature monitoring circuit based on an adjustable current source and a diode.

The monitoring and compensation circuitry on the integrated circuit may have multiplexer circuitry for switching between multiple monitoring circuits (e.g., monitoring circuits for threshold voltage measurements, temperature measurements, etc.). An analog-to-digital converter in the monitoring and compensation circuitry may be used to make signal measurements on the monitoring circuits. A digital-to-analog converter and an associated output buffer may be used to provide sensitive circuits on the integrated circuit with adjusted power supply signals. A control circuit in the monitoring and compensation circuitry may control operation of the monitoring circuits, multiplexer, and analog-to-digital and digital-to-analog converters.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to complementary metal-oxide-semiconductor (CMOS) integrated circuits having n-channel metal-oxide-semiconductor (NMOS) transistors and p-channel metal-oxide-semiconductor (PMOS) transistors. The invention also relates to circuitry and methods for ensuring proper operation of CMOS integrated circuits that are exposed to changes in temperature and changes in transistor threshold voltages due to aging.

Figure 1:
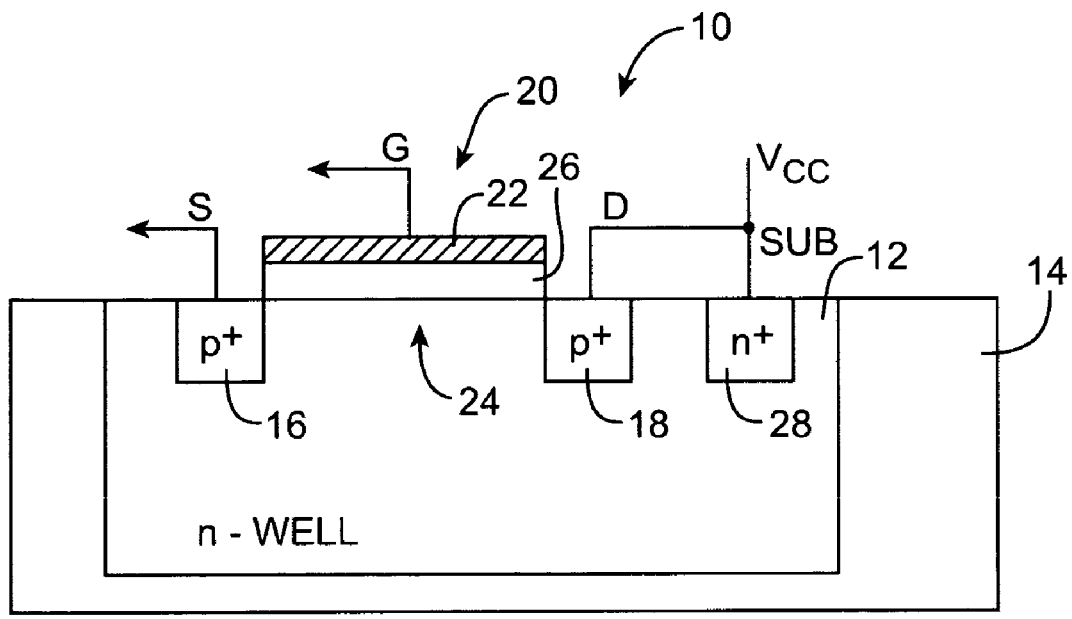
FIG. 1 is a cross-sectional side view of an illustrative p-channel metal-oxide-semiconductor transistor.

A cross-section of a typical PMOS transistor 10 on a CMOS integrated circuit is shown in FIG. 1. Transistor 10 may be formed in an n-type well 12 on a silicon substrate 14. Heavily-doped p+ regions are used to form a source 16 (S) and drain 18 (D). The transistor is controlled by applying signals to gate 20 (G). Gate 20 has a gate conductor 22, which is separated from an underlying channel region 24 in well 12 by a gate oxide 26. A heavily-doped n+ region 28 is used to form a "substrate" or bulk contact (SUB).

Transistors such as transistor 10 may be used in a variety of different circuits on a CMOS integrated circuit. For example, transistors such as transistor 10 may be used to form digital and analog circuitry including NOR gates, inverters, and other logic gates, voltage and current sources, buffers, etc.

Figure 2:
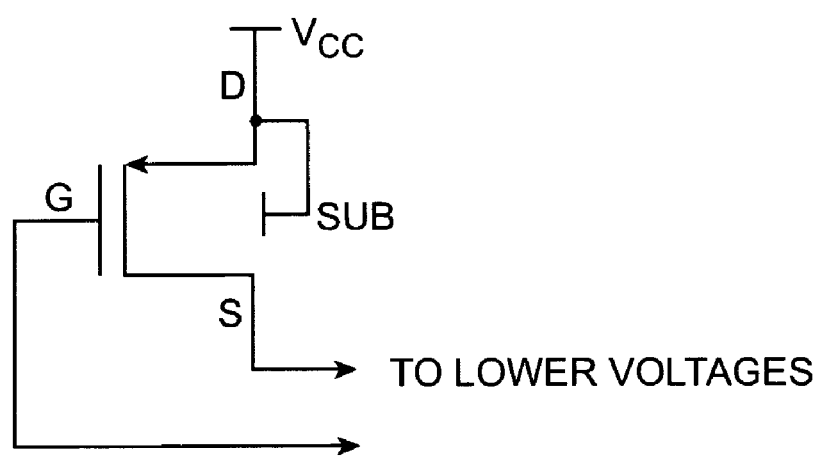
FIG. 2 is a circuit diagram of the p-channel metal-oxide-semiconductor transistor of FIG. 1.

Although the precise operating environment of a given PMOS transistors depends on the application for which that PMOS transistor is being used, PMOS transistors are frequently used in configurations in which the source and gate terminals are exposed to relatively low voltages and the drain and SUB terminals have higher voltages. For example, as shown in the diagram of FIG. 1 and the corresponding circuit-schematic version of transistor 10 that is shown in FIG. 2, the drain and substrate terminals of transistor 10 may be connected to a positive power supply voltage of Vcc, whereas the source and gate terminals may be connected to lower voltages in the remainder of the circuit.

Under these operating conditions, the threshold voltage of transistor 10 will drift over time due to the effects of negative bias temperature instability (NBTI). When a circuit is used for a relatively long period of time (e.g., 10 years or more) or when the temperature and bias-induced stress on a transistor is particularly high, the threshold voltage of a PMOS transistor may increase by tens of millivolts due to NBTI. Similar, though generally less severe, changes to the threshold voltage of NMOS transistors occur due to charge accumulation in gate oxide layer 26 from hot electrons.

Figure 3:
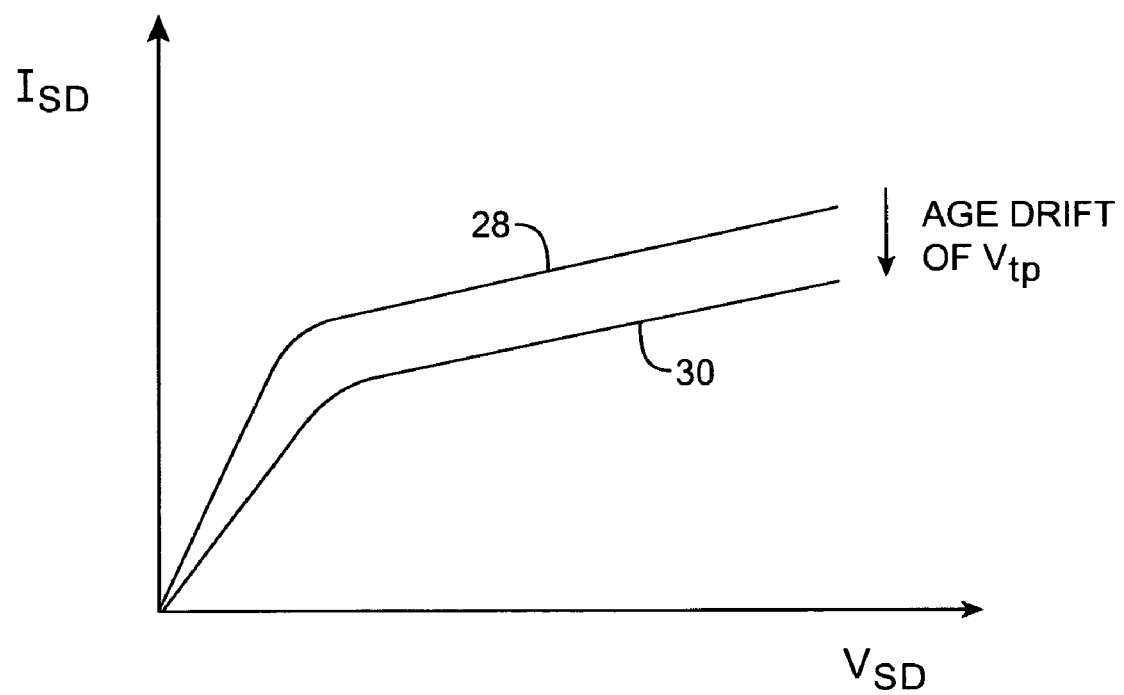
FIG. 3 is a circuit diagram of the current-voltage characteristic for an illustrative metal-oxide-semiconductor transistor showing the effects of age-induced threshold-voltage drift.

The impact of threshold voltage drift in a typical PMOS transistor is shown in the transistor current-voltage characteristic of FIG. 3. Initially, the source-drain current of a PMOS transistor may follow curve 28. As the transistor ages, its threshold voltage $V_{tp}$ will increase due to NBTI. For example, after several years of operation, the threshold voltage of the transistor may be 10 mV higher. This makes the transistor harder to turn on, so that the current-voltage characteristic of the transistor follows curve 30. Similar reductions in the current are exhibited when the operating temperature of a transistor increases or when an NMOS transistor experiences gate-oxide charge accumulation due to aging.

A CMOS circuit may need to operate in a system for a long period of time (e.g., 10 years or more) and/or at an elevated temperature (e.g., 100 C or more). Under these conditions, changes in transistor behavior can be significant. Particularly in CMOS circuits that contain sensitive circuitry (such as high-performance analog and/or digital circuits), transistor performance must be stabilized if reliable high-performance operation is desired.

Figure 4:
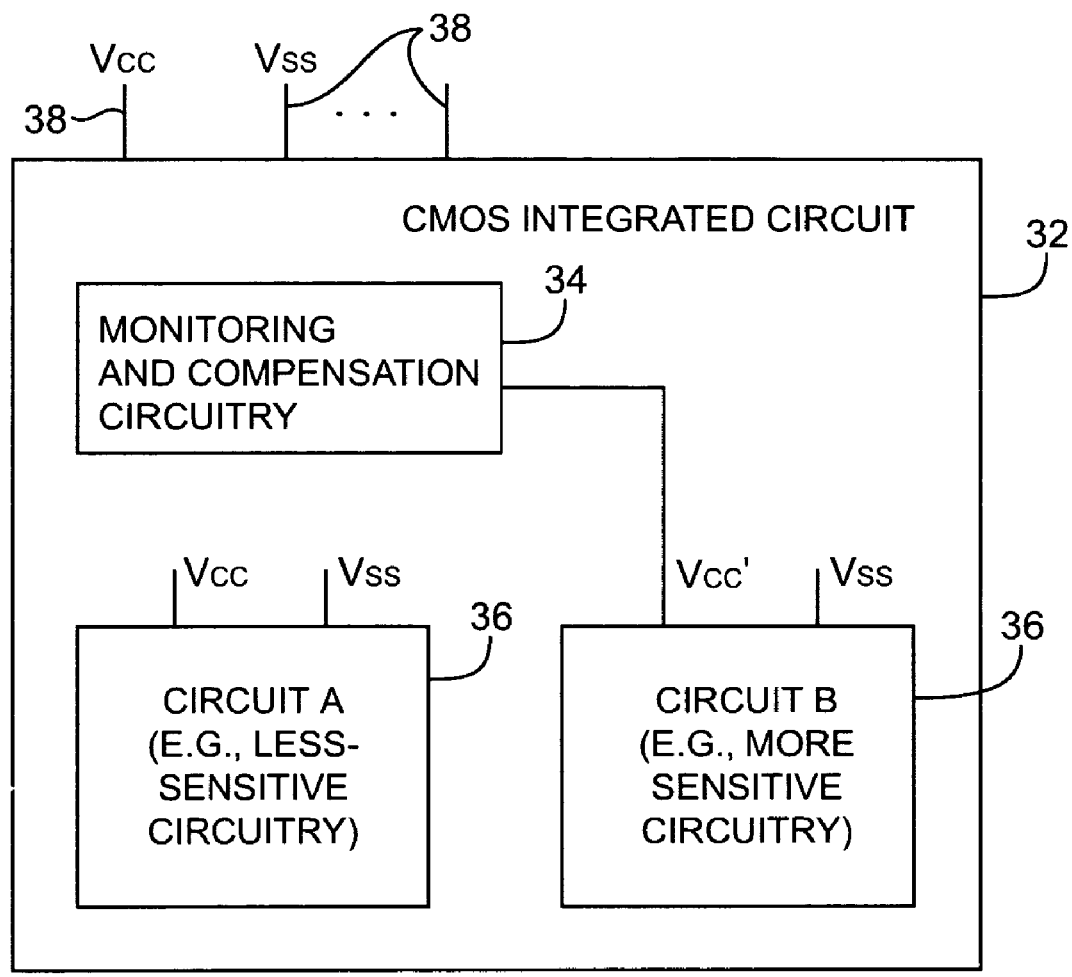
FIG. 4 is a diagram of an illustrative integrated circuit having monitoring and compensation circuitry for stabilizing operation in accordance with the present invention.

In accordance with the present invention, a CMOS integrated circuit is provided that operates properly even when subjected to temperature changes or changes in the threshold voltages of its transistors. As shown in FIG. 4, a CMOS integrated circuit 32 in accordance with the present invention may have monitoring and compensation circuitry 34. Circuitry 34 may be used to measure changes in operating temperature and shifts in threshold voltage. These measurements are used by circuitry 34 to produce adjusted power supply voltages. The adjusted power supply voltages compensate for the effects of temperature changes and threshold voltage shifts and thereby help to ensure that the circuitry of integrated circuit 32 works satisfactorily.

A circuit such as integrated circuit 32 may be supplied with power supply voltages such as a positive power supply voltage of Vcc (e.g., 1.2 V) and a ground voltage of Vss (e.g., 0 V) using pins 38. These are merely illustrative power supply voltages that may be used by CMOS integrated circuit 32. In general, there may be any suitable number of different power supply voltages provided to circuit 32 at any suitable voltages levels. Moreover, power supply voltages may be generated on circuit 32 using on-chip circuitry such as charge pump circuitry if desired. In the following discussion, some circuits are shown as being powered by power supply voltages of Vcc and Vss for clarity. In general, however, any suitable power supply voltages may be used with the circuitry of CMOS integrated circuit 32.

As shown in FIG. 4, a CMOS circuit such as CMOS integrated circuit 32 may have multiple sub-circuits 36 (e.g., circuit A and circuit B). Not all of the circuitry on integrated circuit 32 will be equally sensitive to temperature and threshold-voltage changes. Some circuits (e.g, circuit A) may contain relatively less-sensitive circuitry such as low-speed (DC) logic. Other circuits (e.g., circuit B) may contain sensitive high-performance digital or analog circuits such as phase-locked loops, delay-locked loops, input-output buffers, etc. The proper operation of such sensitive circuits may depend critically on the voltages used to drive the circuit, the operating temperature of the circuit, and the threshold voltages associated with the circuit's transistors.

The monitoring and compensation circuitry 34 can compensate for changes in temperature and threshold voltage by changing the power supply voltages used by all or substantially all of the circuitry on integrated circuit 32. If desired, the amount of resources required for monitoring and compensation circuitry 34 may be minimized by supplying adjusted power supply voltages to only sensitive circuits such as circuit B. With one suitable approach, the ground voltage Vss is left unchanged and the positive power supply voltage is adjusted to produce an adjusted power supply voltage Vcc' that compensates for temperature changes and threshold-voltage drift effects.

If desired, other power supply voltages can be adjusted to stabilize circuit 32. For example, Vss could be adjusted while Vcc is held constant, Vss and Vcc could both be adjusted, the voltages used to bias substrate terminals such as the SUB terminal of FIGS. 1 and 2 could be adjusted (alone or in combination with other power supply voltage adjustments), or other circuit voltages could be adjusted. The invention will be discussed primarily in the context of monitoring and compensation circuitry that produces an adjusted positive power supply voltage Vcc' to stabilize operation of the circuit 32, but this is merely illustrative.

Figure 5:
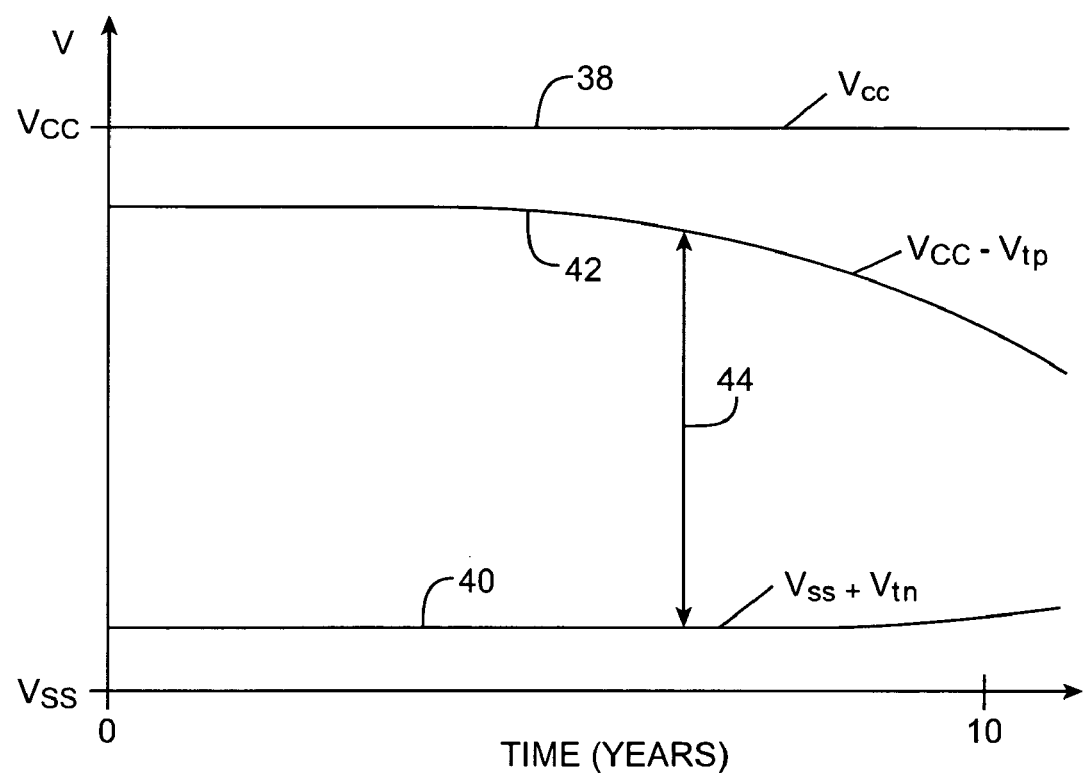
FIG. 5 is a graph showing how PMOS and NMOS threshold voltages drift with age in conventional CMOS circuits.

The effects of NBTI and gate-oxide charge accumulation in PMOS and NMOS transistors on a conventional CMOS integrated circuit are shown in FIG. 5. The graph of FIG. 5 contains a line 38 that represents the conventional (unadjusted) positive power supply voltage Vcc. Because no adjustments are made to Vcc in a conventional circuit, Vcc is a constant, and the line 38 is flat. Over time, the threshold voltage Vtn of the NMOS transistors on the circuit increases, as shown by line 40. The threshold voltage Vtp of the PMOS transistors on the circuit also increases, as shown by line 42.

As the threshold voltages Vtp and Vtn drift higher over time, the operating voltage range 44 for circuits powered by Vcc and Vss, which is represented by the distance between lines 40 and 42, decreases. When the operating voltage range 44 is too small, sensitive circuitry on the CMOS device no longer operates satisfactorily. As a result, the useful life of a conventional CMOS integrated circuit may be shorter than desired. Similar changes in the operating voltage range 44 occur when a conventional integrated circuit is operated at elevated temperatures, which may undesirably restrict the allowed operating temperatures for such circuits.

When the monitoring and compensation circuitry 34 of a CMOS integrated circuit 32 in accordance with the present invention is used, the changes in temperature and/or threshold voltage drift are detected and suitable compensating adjustments are made to appropriate power supply voltages. In particular, when CMOS integrated circuit 32 experiences increases in Vtn and Vtp due to NBTI and gate-oxide charge accumulation effects, monitoring and compensation circuitry 34 may produce a positive power supply voltage Vcc' that compensates for these increases, as shown in FIG. 6.

Figure 6:
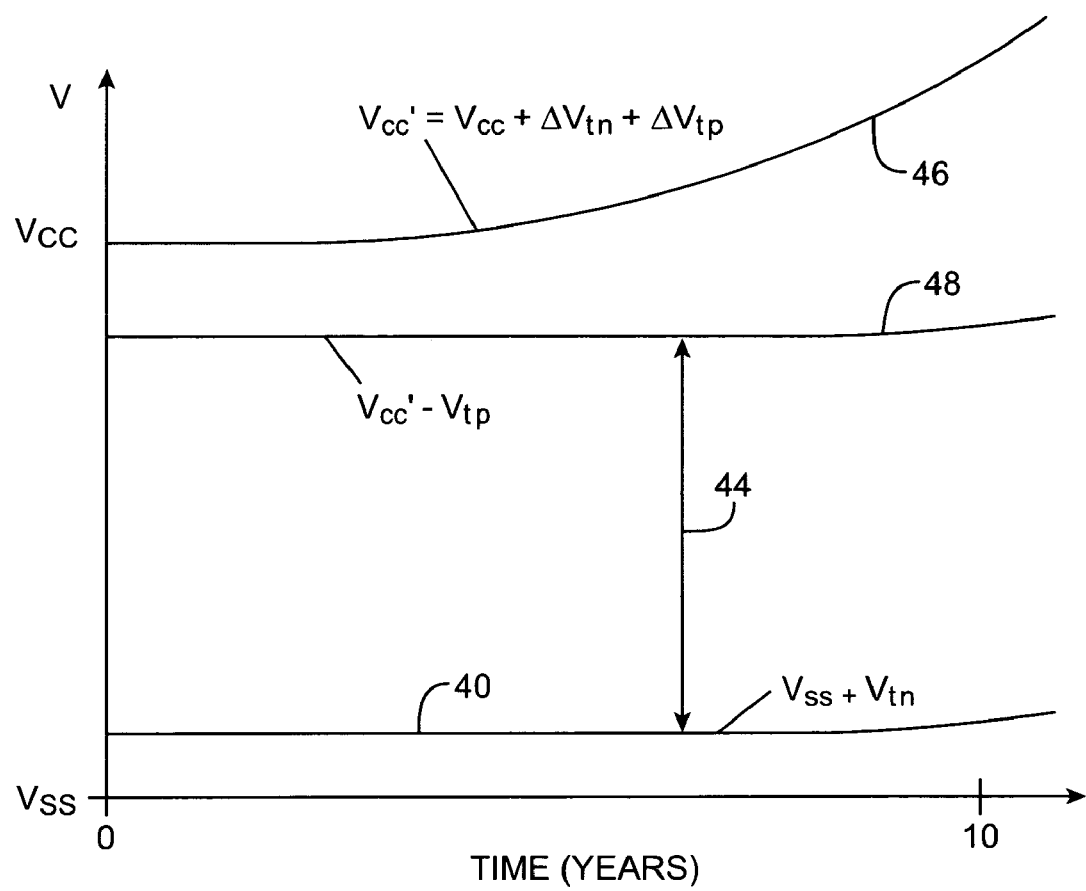
FIG. 6 is a graph showing how monitoring and compensation circuitry may be used to compensate for the effects of threshold voltage drift in accordance with the present invention.

As shown by line 46 in FIG. 6, the value of Vcc' may be increased over Vcc by an amount equal to the measured increase in the NMOS threshold voltage (ΔVtn) plus the measured increase in the PMOS threshold voltage (ΔVtp). The resulting operating range 44, which is given by the distance between the line 48 (Vcc'-Vtp) and line 40 (Vss+Vtn), remains constant as a function of time, rather than decreasing with age as with the conventional arrangement of FIG. 5. Changes in circuit operation due to increases (or decreases) in operating temperature T may also be compensated by increasing (or decreasing) Vcc'. By providing the sensitive circuits on CMOS integrated circuit 32 such as sensitive circuit B of FIG. 4 with the adjusted value of power supply voltage Vcc', proper operation of the sensitive circuits and therefore proper operation of the entire integrated circuit 32 may be ensured.

Providing the adjusted value of power supply voltage Vcc' also helps the sensitive circuits by providing a level of isolation from the integrated circuit's main power supply. Conventional integrated circuits sometimes contain circuitry for performing on-chip power supply sub-regulation, which helps to reduce noise effects. With the present invention, the adjusted value of power supply voltage Vcc' may be provided using a sub-regulation arrangement. The additional isolation provided by this type of arrangement may help to reduce power supply noise effects in addition to ensuring proper operation of sensitive circuits due to changes in temperature and threshold voltage.

In general, any suitable MOS integrated circuit may be stabilized using monitoring and compensation circuitry such as monitoring and compensation circuitry 34 of FIG. 4. For example, circuits containing high-speed digital signal paths can be stabilized to ensure critical timing constraints are satisfied. Circuits containing high-performance analog circuits can also be stabilized to ensure accurate operation.

An example of a circuit that may benefit from the stabilization provided by monitoring and compensation circuitry 34 is a phase-locked-loop circuit. Phase-locked loops may be used in a variety of applications, including clock and data recovery and other high-frequency operations. Another example of a circuit that may benefit from the stabilization provided by monitoring and compensation circuitry 34 is a delay-locked loop.

Figure 7:
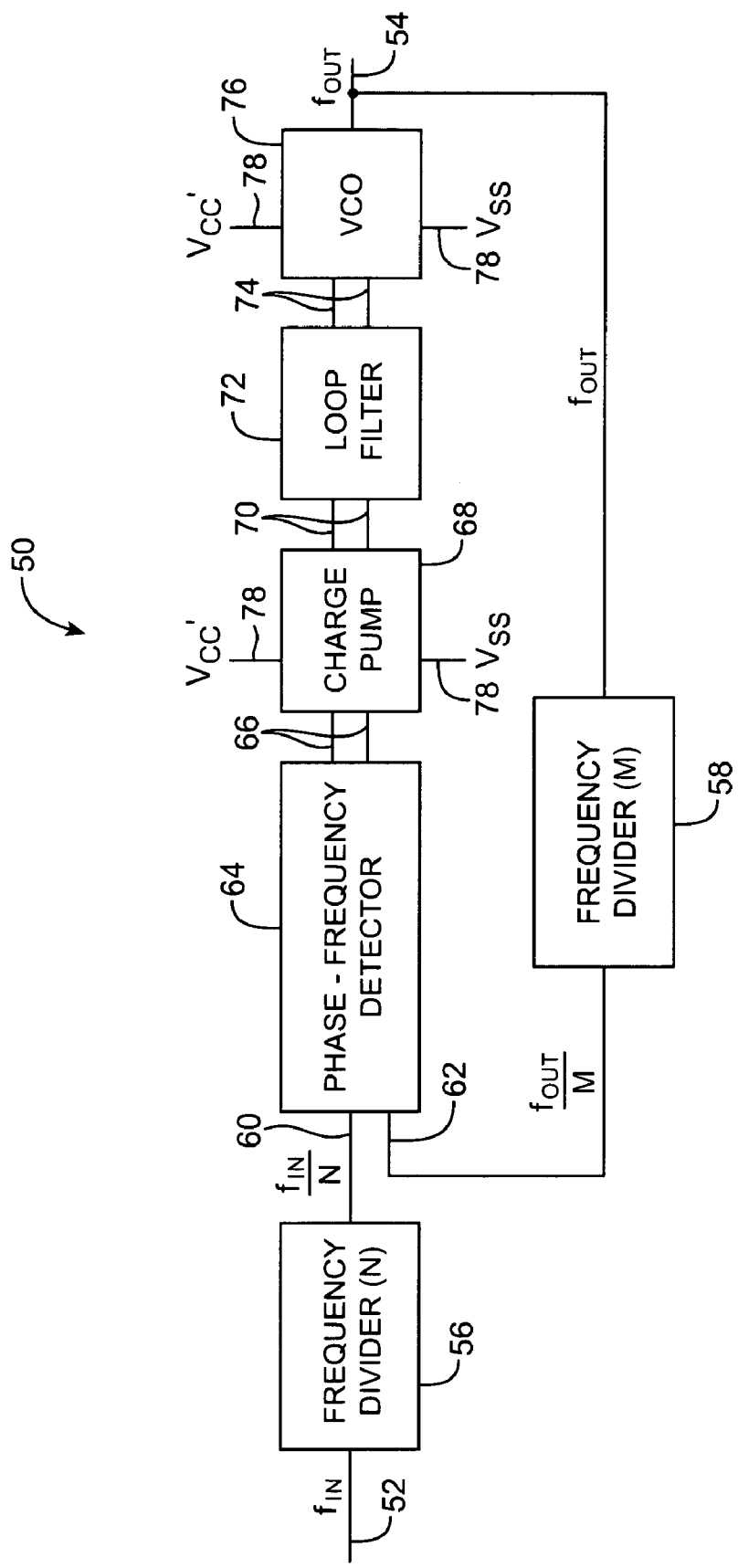
FIG. 7 is a schematic circuit diagram of an illustrative CMOS phase-locked-loop circuit that may be stabilized using the monitoring and compensation circuitry of the present invention.

An illustrative phase-locked-loop circuit 50 that may be used on integrated circuit 32 is shown in FIG. 7. Phase-locked-loop circuit 50 has an input 52 and an output 54. A frequency divider such as frequency divider 56 (e.g., a counter) may be used to reduce the input frequency $f_{IN}$ (e.g., to $f_{IN}/N$). A frequency divider such as frequency divider 58 may, if desired, be used to divide the feedback signal $f_{OUT}$ from output 54 (e.g., to produce a divided-down feedback signal $f_{OUT}/M$). The divided-down input frequency $f_{IN}/N$ and feedback signal $f_{OUT}/M$ may be provided to inputs 60 and 62 of phase-frequency detector 64. Phase-frequency detector 64 compares these signals and generates corresponding output signals on outputs 66. The phase-frequency detector 64 provides two output signals on its outputs 62. When the signal on input 60 is ahead of the signal on input 62, a first control signal on a first output 66 is taken high and a second control signal on a second output 66 is taken low. When the signal on input 60 is behind the signal on input 62, the first control signal is taken low and the second control signal is taken high. The outputs provided by the phase-frequency detector therefore act as control signals for the rest of the phase-locked loop. These control signals are used to adjust the frequency of the feedback signal produced by the voltage-controlled oscillator (VCO) 76 at output 54, so that $f_{OUT}/M$ matches $f_{IN}/N$.

The output signals from the phase-frequency detector 64 are provided to charge pump 68. The charge pump 68 produces output currents on outputs 70 that are proportional to the incoming control signals (i.e., the detector output signals). These currents are provided to loop filter 72. Loop filter 72 filters the output signals from charge pump 68 to remove undesirable frequency components. Loop filter 72 also converts the current-based signals on lines 70 into corresponding voltage-based signals. The resulting filtered voltage signals are provided over lines 74 to voltage-controlled oscillator 76. Voltage-controlled oscillator 76 produces an output signal $f_{OUT}$ whose frequency is proportional to the voltages on lines 74. The output signals from the voltage-controlled oscillator 76 may be feed back to input 62 of the phase/frequency detector 64 via frequency divider 58.

Some portions of circuit 50 such as charge pump 68 and voltage-controlled oscillator 76 are particularly sensitive to changes in temperature and transistor threshold voltage. The accuracy of phase-locked-loop circuit 50 is therefore dependent on the proper operation of charge pump 68 and voltage-controlled-oscillator 76.

Although the illustrative circuit of FIG. 7 is a phase-locked loop, sensitive circuitry 36 (FIG. 4) may be circuitry such as a delay-locked loop circuit in which a delay line is used to insert a controllable delay between its clock input and output lines or any other suitable sensitive circuitry.

Sensitive circuits such as these may be provided with modified power supply voltages from monitoring and compensation circuit 34 (FIG. 4). The charge pump 68 and voltage-controlled oscillator 76 may, for example, be provided with a modified positive power supply voltage Vcc' and an unmodified ground potential Vss at power supply inputs 78. By adjusting the power supply voltages used by charge pump 68 and voltage-controlled oscillator 76, phase-locked-loop circuit 50 (or a delay-locked loop circuit) will function accurately, even if the operating temperature and/or threshold voltages of the transistors of circuit 32 change.

Figure 8:
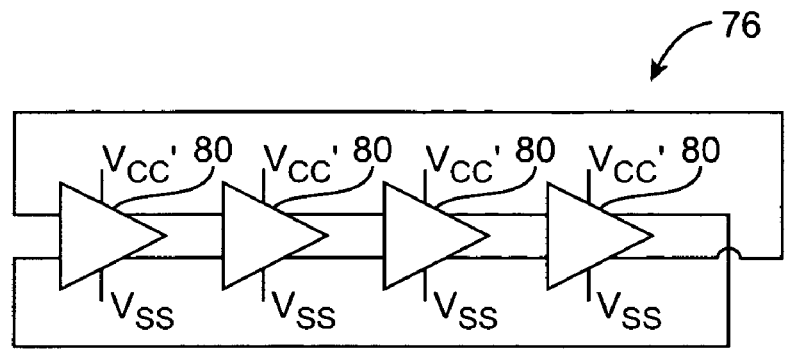
FIG. 8 is a schematic circuit diagram of an illustrative four-stage voltage-controlled oscillator for a phase-locked loop of the type shown in FIG. 7.

Voltage-controlled oscillator 76 may have four stages 80 (for example), as shown in FIG. 8. The outputs of each stage are passed to the next stage in series, until the differential outputs of the last stage 80 are inverted and fed back to the input of the first stage 80. This type of arrangement produces an oscillating signal whose period is determined by the propagation delay between stages.

Figure 9:
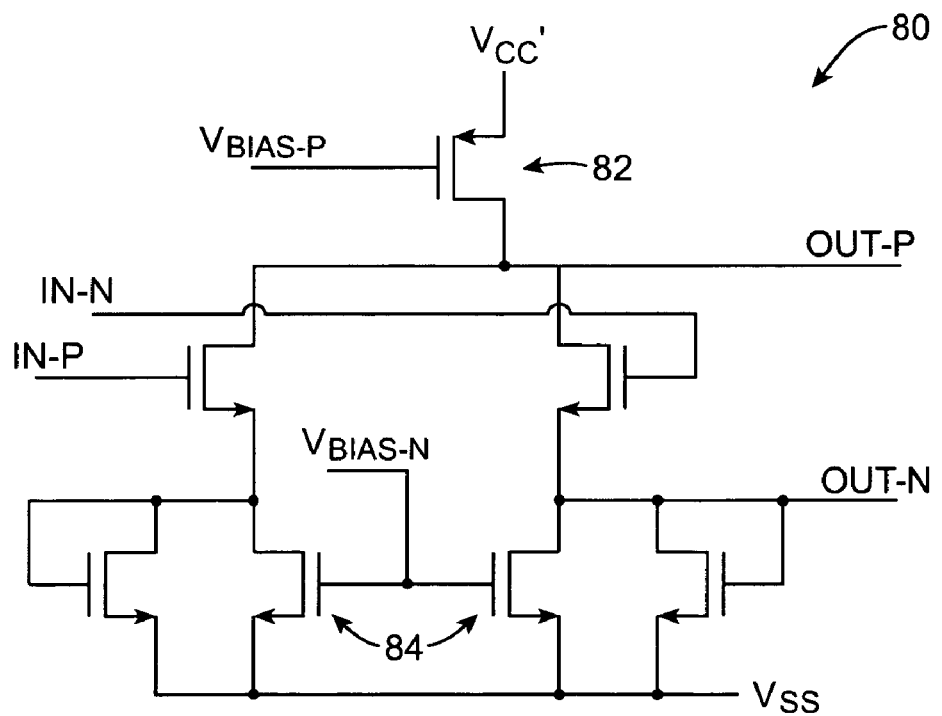
FIG. 9 shows illustrative circuitry that may be used in each stage of a voltage-controlled oscillator of the type shown in FIG. 8.

An illustrative stage 80 is shown in FIG. 9. As shown in FIG. 9, each stage 80 has differential inputs IN-N and IN-P and corresponding differential outputs OUT-N and OUT-P. The circuitry of stage 80 may be powered by an adjusted power supply voltage Vcc' and a ground voltage Vss. Bias voltages $V_{BIAS-P}$ and $V_{BIAS-N}$, which are received from loop filter 72 on lines 74 (FIG. 7) may be applied to the gates of transistors 82 and 84 to control the speed of stage 80. With one illustrative arrangement, Vcc' may be on the order of 1.2 volts. The ground voltage may be provided by a source of constant ground potential. The voltage level for $V_{BIAS-P}$ may be about 0.85 volts and $V_{BIAS-N}$ may be about 0.35 volts. Under these biasing conditions, the NMOS and PMOS transistors of circuit 80 are susceptible to threshold voltage drift.

During operation of the integrated circuit 32, monitoring and compensation circuitry 34 measures changes in temperature and changes in transistor threshold voltage. To ensure that the measured changes in threshold voltage are accurate, a differential measurement technique may be used in which measurements are made on both a continuously-biased circuit (where the threshold changes due to NBTI and gate oxide charge accumulation are will be greatest) and on an intermittently-biased circuit (where the threshold voltage will change much less and can serve as a baseline). By comparing measurements from these two circuits (i.e., by taking the difference between these measurements), the changes in threshold voltage $\Delta Vtn$ and $\Delta Vtp$ may be accurately determined.

Figure 10:
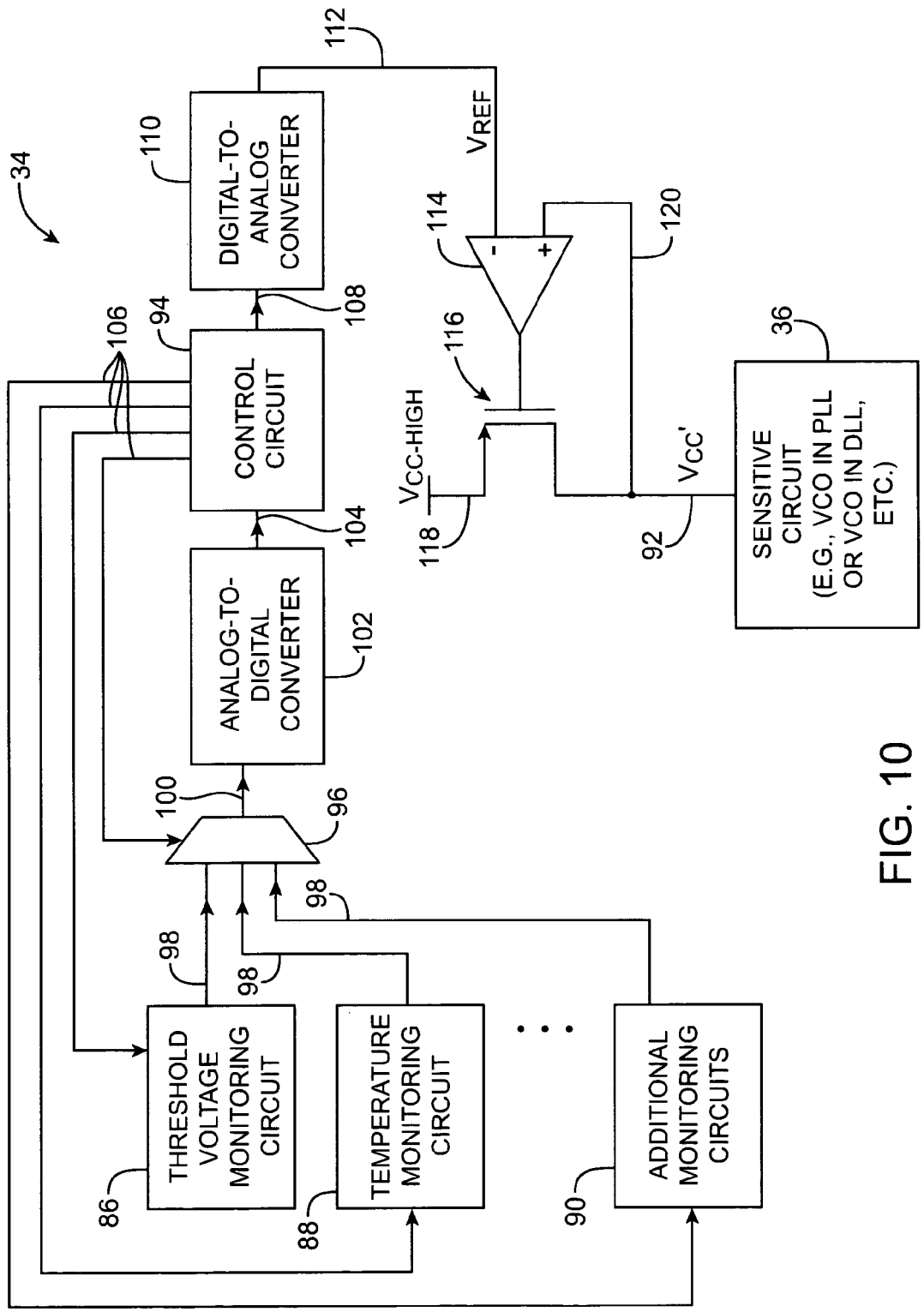
FIG. 10 is a diagram of illustrative monitoring and compensating circuitry that may be used to automatically adjust the power supply voltage of sensitive circuitry on an integrated circuit in accordance with the present invention.

Any suitable monitoring and compensation circuitry 34 may be used to compensate for the effects of changes in temperature and threshold voltage in integrated circuit 32. Illustrative monitoring and compensation circuitry 34 is shown in FIG. 10. Monitoring and compensation circuitry 34 may take measurements from various circuits such as one or more threshold monitoring circuits 86, one or more temperature monitoring circuits 88, and one or more additional monitoring circuits 90. These measurements are processed by the monitoring and compensation circuitry 34 and one or more corresponding adjusted power supply voltages are provided accordingly.

In the example of FIG. 10, monitoring and compensation circuitry 34 produces an adjusted value of the normal positive power supply voltage Vcc, called Vcc'. Vcc' is generally higher than the nominal value of Vcc (i.e., Vcc' is boosted relative to Vcc) to overcome the shrinking operating voltage range 44 due to increases of Vtn and Vtp, as discussed in connection with FIG. 6.

The operation of monitoring and compensation circuitry 34 may be controlled using a control circuit 94. Control circuit 94 may be implemented using custom logic, a processor, memory, etc. Control circuit 94 may be used to implement the functions of a state machine that makes decisions on how to adjust Vcc' based on the measurements from circuits such as circuits 86, 88, and 90.

A multiplexer 96 or other suitable switching circuitry under the control of control circuitry 94 may be used to select which circuit to monitor. Multiplexer 96 can be controlled to selectively connect each of its inputs 98 to a corresponding output 100. The signals on output 100 may be digitized using an analog-to-digital converter 102. Measurements may be made on circuits 86, 88, and 90 in series (i.e., by selectively measuring signals from each of these circuits using multiplexer 96) or multiple multiplexers and signal paths may be connected to analog-to-digital converters such as analog-to-digital converter 102 to make measurements in parallel. Control lines such as control lines 106 may be used to control circuits such as circuits 86, 88, 90, and multiplexer 96.

Digital signals from analog-to-digital converter 102 may be provided to control circuitry 94 over paths such as path 104. The control circuitry 94 may process raw measurements from the monitoring circuits to determine $\Delta Vtp$ and $\Delta Vtn$. The control circuitry may then determine how to adjust Vcc' to compensate for these changes in transistor threshold voltage. For example, the value of Vcc' may be set using equation (1).

$$Vcc'=Vcc(\text{nominal})+\Delta Vtp+\Delta Vtn \tag{1}$$

To produce Vcc' at output terminal 92, the control circuit 94 may send suitable digital signals to digital-to-analog converter 110 over path 108. In response to the digital signals provided on path 108, digital-to-analog converter 110 may produce a reference voltage $V_{REF}$ at its output 112. The reference voltage $V_{REF}$ may be the same as the desired Vcc' or a signal that is proportional to the desired Vcc'. In the example of FIG. 10, the circuitry that converts $V_{REF}$ to $V_{cc}'$ has unitary gain, so $V_{REF}$=Vcc'. This is, however, merely one illustrative arrangement that may be used.

As shown in FIG. 10, $V_{REF}$ may be provided to the negative input of differential amplifier circuit 114. The amplifier 114 may also receive a feedback signal at its positive input via feedback line 120. If the value of Vcc' on feedback line 120 exceeds $V_{REF}$, the corresponding output of amplifier 114 will be driven higher, which will cause the voltage on the gate of PMOS transistor 116 to go higher. If the value of Vcc' on feedback line 120 falls below $V_{REF}$, the output of amplifier 114 will be driven lower.

Transistor 116 is powered by an elevated positive power supply voltage Vcc-high at terminal 118. The voltage Vcc-high is preferably sufficiently large to ensure that the largest Vcc' that will be needed during the lifetime of integrated circuit 32 can be produced at terminal 92. For example, the voltage Vcc-high may be 1.5 volts. The power supply voltage Vcc-high may be supplied by a suitable external power supply source via a suitable pin 38 on integrated circuit 32 or may be generated on circuit 32 (e.g., using a charge pump circuit).

When the voltage on the gate of transistor 116 is driven higher because Vcc' on feedback line 120 has risen above the value of $V_{REF}$ on line 112, transistor 116 is turned on less strongly, which causes the voltage on line 92 to drop towards $V_{REF}$. Similarly, if the value of Vcc' on feedback line 120 is less than the value of $V_{REF}$, transistor 116 is provided with a lower gate voltage, which tends to turn transistor 116 on more strongly and raise Vcc' towards $V_{REF}$. The feedback arrangement of FIG. 10 therefore provides a strengthened power supply voltage Vcc' at terminal 92 that is pinned to the voltage level of $V_{REF}$ that is provided at the output 112 of digital-to-analog converter 110.

The monitoring and compensation circuitry 34 may be used to produce a value of Vcc' using equation 1 that compensates for the effects of changes in transistor threshold voltage. By supplying an adjusted Vcc' of this type to sensitive circuits 36 such as the charge pump or voltage-controlled oscillator in a phase-locked loop or delay-locked loop, the sensitive circuits will not suffer from the performance degradation that would otherwise be experienced as Vtn and Vtp drift due to the age of circuit 32. If desired, circuitry 34 can take into account changes in transistor performance due to changes in operating temperature using an equation such as equation 2, where f(T) is a correction factor that is used to offset transistor performance degradation due to elevated temperatures.

$$Vcc' = Vcc \text{ (nominal)} + \Delta Vtp \text{ and } \Delta Vtn + f(T) \qquad (2)$$

The function f(T) may be determined empirically and programmed into memory in control circuit 94 for use in counteracting the effects of changes in operating temperature. The adverse effects of process and temperature variations may also be mitigated using a replica circuit approach in which some or all of the sensitive circuitry on circuit 32 is duplicated on the circuit 32 and used in a feedback arrangement to correct for variations in performance due to fabrication process variations and temperature variations. Circuitry that is relatively insensitive to process and temperature variations may, if desired, be used in monitoring and compensation circuitry 34 to improve the accuracy of the compensation voltage Vcc' that is produced.

A replica-type circuit or any other suitable circuitry may be used in monitoring circuits such as circuits 86, 88, and 90. With a replica circuit arrangement for use with a phase-locked loop or delay-locked loop, for example, the monitoring circuit may be based on a replica of a VCO stage such as VCO stage 80 of FIG. 9. A replica circuit for a sensitive input-output buffer may be based on a replica of the entire input-output buffer circuit.

Figure 11:
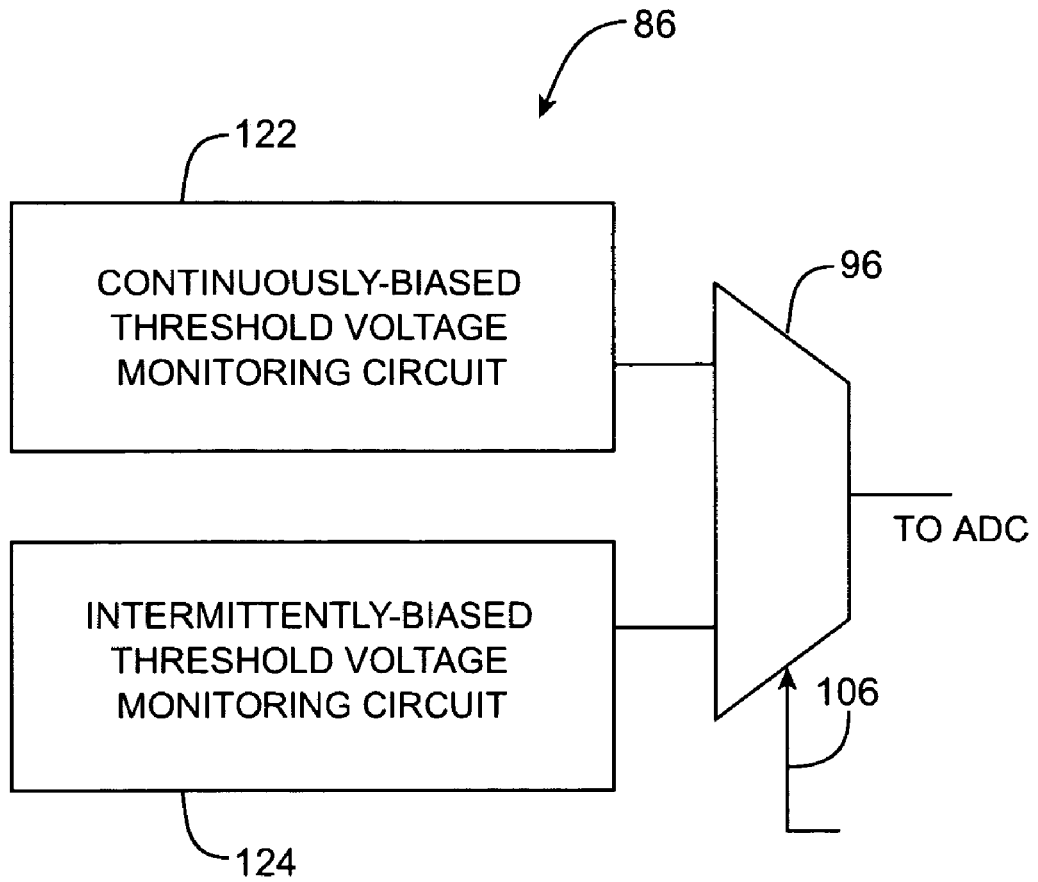
FIG. 11 is a diagram of an illustrative differential monitoring circuit arrangement that may be used in a monitoring and compensation circuit in accordance with the present invention.

An illustrative threshold voltage monitoring circuit 86 that has a continuously-biased threshold voltage monitoring circuit 122 and an intermittently-biased threshold voltage monitoring circuit 124 is shown in FIG. 11. In the continuously-biased threshold voltage monitoring circuit 122, the NMOS and/or PMOS transistors are continuously (or semi-continuously) exposed to bias voltages that induce changes in Vtn and Vtp through effects such as gate-oxide charge trapping and NBTI. The transistors in circuit 122 will therefore exhibit threshold voltage changes that are comparable to those of the transistors in the regular working circuitry on integrated circuit 32. The transistors in intermittently-biased circuit 124 are only biased when it is desired to make a threshold voltage measurement. Because threshold voltage drift is a relatively slow phenomena (typically occurring over years), the transistors in circuit 124 only rarely need to be biased.

The circuitry of circuit 122 and circuit 124 may be similar. Because the main difference between circuits 122 and 124 is the biasing environments in which their respective transistors are maintained, differential threshold voltage measurements may be made by comparing measurements from circuit 122 to those made with circuit 124. The extent of the measured voltage threshold shifts can therefore be accurately ascertained by (for example) treating the threshold voltage measurements from circuit 124 as baseline (unchanged) measurements and subtracting these measurements from the threshold voltage measurements made with circuit 122. Multiplexer 96 may be used to selectively connect the analog-to-digital converter 102 (FIG. 10) to each of circuits 122 and 124.

Figure 12:
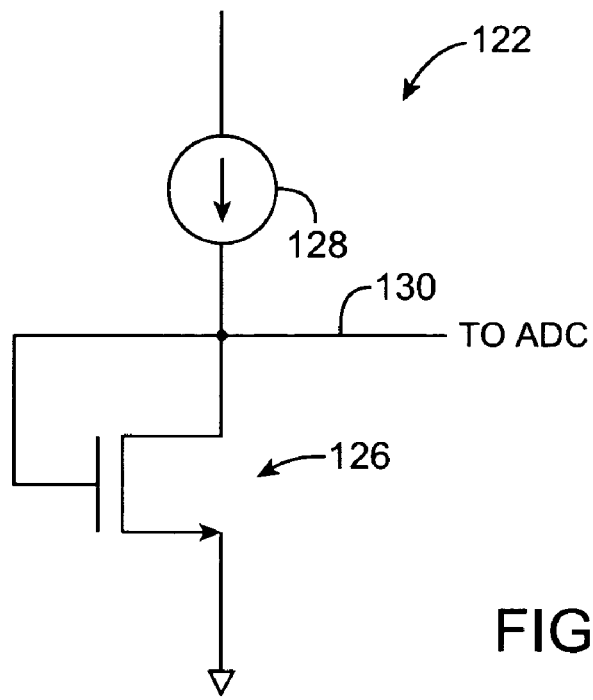
FIG. 12 is a circuit diagram of an illustrative continuously-biased circuit for a monitoring and compensation circuit in accordance with the present invention.
Figure 13:
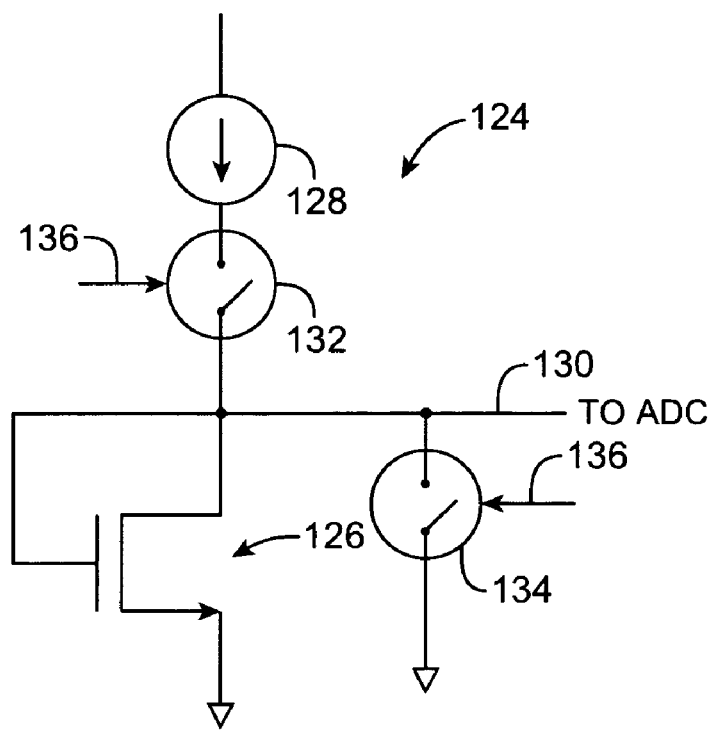
FIG. 13 is a circuit diagram of an illustrative intermittently-biased circuit for a monitoring and compensation circuit in accordance with the present invention.

An illustrative continuously-biased threshold voltage monitoring circuit 122 based on a single MOS transistor is shown in FIG. 12. An illustrative intermittently-biased threshold voltage monitoring circuit 124 based on a single MOS transistor is shown in FIG. 13. The circuits of FIGS. 12 and 13 contain NMOS transistors. The same type of circuits can be used to measure PMOS threshold voltages Vtp.

As shown in FIG. 12, circuit 122 may have a transistor 126 whose threshold voltage is to be measured. A current source 128 may be used to bias transistor 126. The voltage on monitoring output line 130 is proportional to the continuously-biased threshold voltage of transistor 126. This threshold voltage (Vtn-cont-bias) drifts considerably over time due to the continuously applied bias.

As shown in FIG. 13, circuit 124 may also have a transistor 126 whose threshold voltage is to be measured. Current source 128 can be used to bias transistor 126 of FIG. 13 when it is desired to make a threshold voltage measurement. Switching circuitry such as switches 132 and 134 may be controlled by control circuit 94 (FIG. 10) of monitoring and compensation circuitry 34 via control paths 136.

When no measurements are being made (i.e., most of the time), switch 132 is held open, to prevent biasing of transistor 126 by current source 128. Switch 134 is held closed, to ensure that all of the terminals of transistor 126 are grounded. This ensures that transistor 134 is not inadvertently biased.

When measurements are to be made, switch 132 is closed and switch 134 is opened by the control circuit. The control circuit then uses the analog-to-digital converter 102 to measure the voltage on monitoring output line 130.

The voltage on monitoring output line 130 of FIG. 13 is proportional to the intermittently-biased threshold voltage of transistor 126. This threshold voltage (Vtn-int-bias) changes much less than the threshold voltage of the continuously-biased transistors of circuit 122 (and the corresponding continuously-biased transistors of the regular circuitry on integrated circuit 32).

Equation 3 may be used by control circuit 94 to calculate the change in threshold voltage $\Delta Vtn$ from the threshold voltage measurements made with circuits 122 and 124.

$$\Delta Vtn = Vtn\text{-}cont\text{-}bias - Vtn\text{-}int\text{-}bias \quad (3)$$

The change in PMOS transistor threshold voltage ΔVtp may be measured with a continuously-biased PMOS monitoring circuit and an intermittently-biased PMOS monitoring circuit using equation 4.

$$\Delta Vtp = Vtp\text{-}cont\text{-}bias - Vtp\text{-}int\text{-}bias \quad (4)$$

It is generally most accurate to measure changes in threshold voltage using a differential approach of the type described in connection with FIGS. 12 and 13 and equations 3 and 4. However, non-differential threshold voltage measurements may be used by the monitoring and compensation circuitry 34 if desired. This eliminates the need for both continuously-biased and intermittently-biased threshold voltage monitoring circuitry. Moreover, monitoring circuits can be provided that bias transistors by different amounts (i.e., for different amounts of time and with different bias voltages). By using multiple monitoring circuits each of which has a different biasing condition, more information on the threshold voltages of the various transistors in differing parts of the circuitry on circuit 32 can be obtained.

Figure 14:
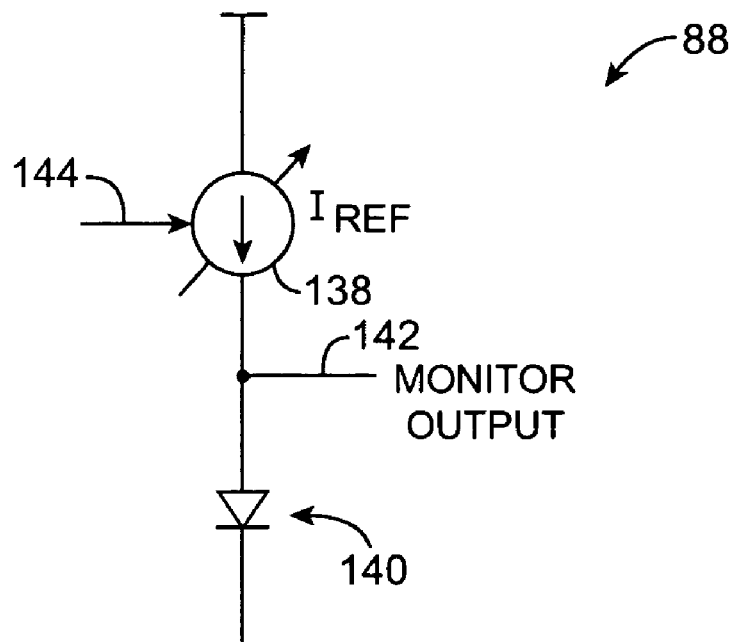
FIG. 14 is an illustrative temperature-monitoring circuit for a monitoring and compensation circuit in accordance with the present invention.

The operating temperature of circuit 32 may be monitored using a temperature monitoring circuit such as temperature monitoring circuit 88 of FIG. 10. An illustrative temperature monitoring circuit 88 is shown in FIG. 14. Circuit 88 of FIG. 14 has an adjustable current source 138 that produces a current $I_{REF}$. The current $I_{REF}$ is driven through diode 140 to produce a corresponding voltage at monitor output 142. The value of $I_{REF}$ may be adjusted by controlling current source 138 with control circuit 94 via input 144. To measure the voltage at monitor output 142, control circuit 94 of FIG. 10 produces a control signal on an appropriate control line 106 that directs multiplexer 96 to connect the monitoring output 142 of circuit 88, which is connected to one of its multiplexer inputs 98, to the multiplexer output 100 for digitization by analog-to-digital converter 102.

Figure 15:
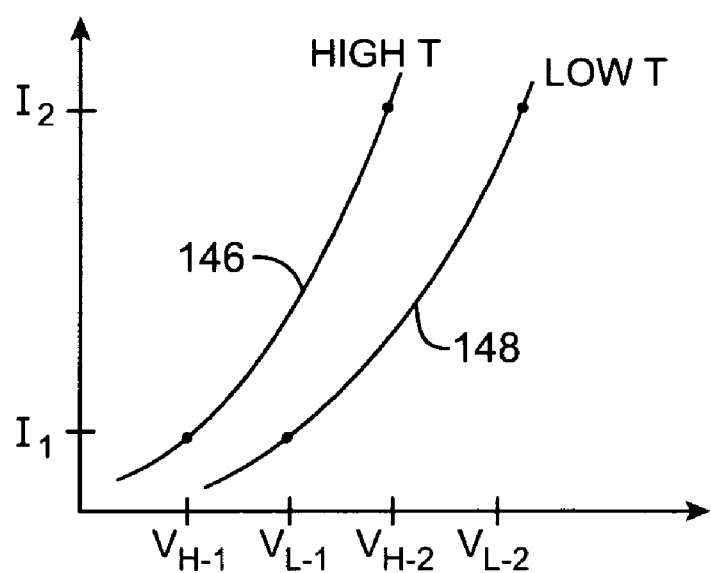
FIG. 15 is a graph showing how the circuit of FIG. 14 may be used in measuring the operating temperature of a CMOS integrated circuit in accordance with the present invention.

The graph of FIG. 15 shows how control circuit 94 may use temperature monitoring circuit 88 to make temperature measurements. The current-voltage characteristic of diode 22 (FIG. 14) is dependent on temperature. At high temperatures, the diode has a current-voltage curve such as curve 146. At lower temperatures, the diode has a characteristic curve such as curve 148. To make a temperature measurement, the control circuit adjusts current source 144 to produce a desired current $I_1$ and takes a corresponding voltage measurement at terminal 142 with analog-to-digital converter 102. The control circuit than adjusts the current source 144 to produce a current $I_2$ and takes another corresponding voltage measurement. The voltage and current measurements are then used to calculate the temperature of the circuit 32, using the known temperature-dependent electrical properties of diode 140. If, for example, the voltages $V_{H\text{-}1}$ and $V_{H\text{-}2}$ are measured by the control circuit, the control circuit can conclude that the circuit is being operated at a high temperature (see curve 146). If the voltages $V_{L\text{-}1}$ and $V_{L\text{-}2}$ are measured, the control circuit can conclude that the temperature of circuit 32 is low (curve 148). If more accurate temperature measurements are desired, a series of current and voltage measurements may be made and curve fitting techniques can be used to extract the temperature reading.

Figure 16:
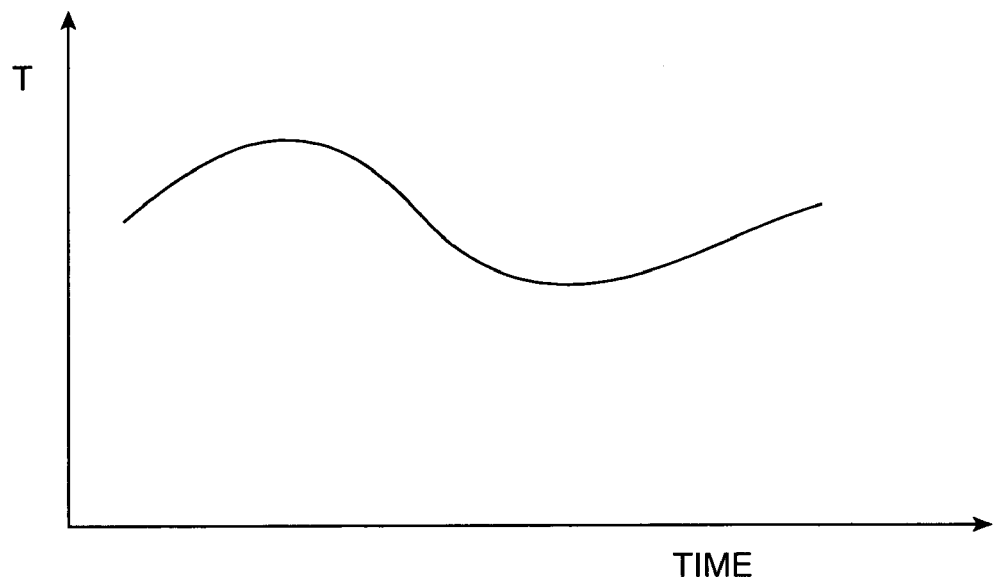
FIG. 16 is a graph showing how the operating temperature of an illustrative CMOS integrated circuit might vary as a function of time.

The operating temperature T of integrated circuit 32 may change over time due to changes in circuit loading and changes in the environment in which the circuit is running. A graph showing how the temperature T of circuit 32 may vary as a function of time is shown in FIG. 16. When monitoring and compensation circuitry 34 is used to compensate for the effects of temperature changes on the operation of circuit 32, the power supply voltage Vcc' that is provided to appropriate circuits on integrated circuit 32 may be varied by the monitoring and compensation circuitry 32 accordingly, as shown in FIG. 17.

Figure 17:
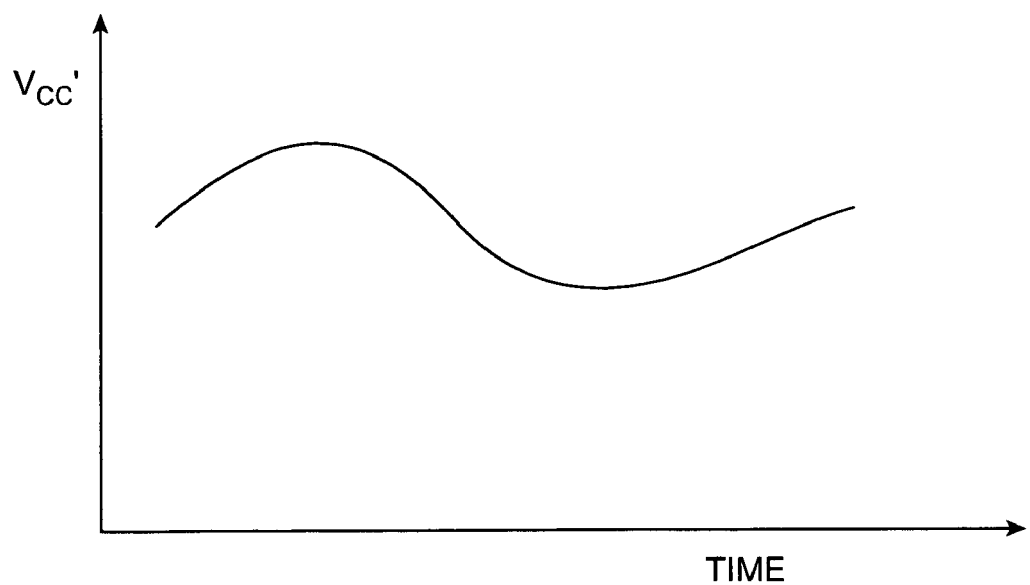
FIG. 17 is a graph showing how a monitoring and compensation circuit may adjust the positive power supply voltage for a sensitive circuit in real time to compensate for temperature changes of the type shown in FIG. 16 in accordance with the present invention.

The increases and decreases in Vcc' shown in FIG. 17 are selected to offset the changes to transistor performance that are expected for the temperature changes monitored in FIG. 16. The amount of Vcc' adjustment needed to offset a given amount of measured temperature change can be determined empirically (e.g., to produce information on function f(T) of equation 2) and this information can be stored in memory in control circuitry 94 for use when operating circuit 32.

Temperature compensation may be provided in combination with threshold-voltage drift compensation (e.g., using equation 2) or temperature compensation or threshold-voltage drift compensation may be provided alone. As shown in FIG. 10, additional monitoring circuits such as circuit 90 may be used to monitor other operating parameters (e.g., the value of Vcc, the value of Vss, the voltages and currents at other locations in the circuit 32, the values of external voltages and currents, temperatures, capacitances, inductances, or any other suitable measurable parameters that affect operation of circuit 32). Power supply voltage adjustments (e.g., adjustments to Vcc' and/or other power supply voltages) and/or other suitable circuit adjustments can be made by the monitoring and compensation circuitry 34 based on information from additional circuits 90 and information on threshold-voltage measurements and temperature measurements from circuits such as circuits 86 and 88.

Figure 18:
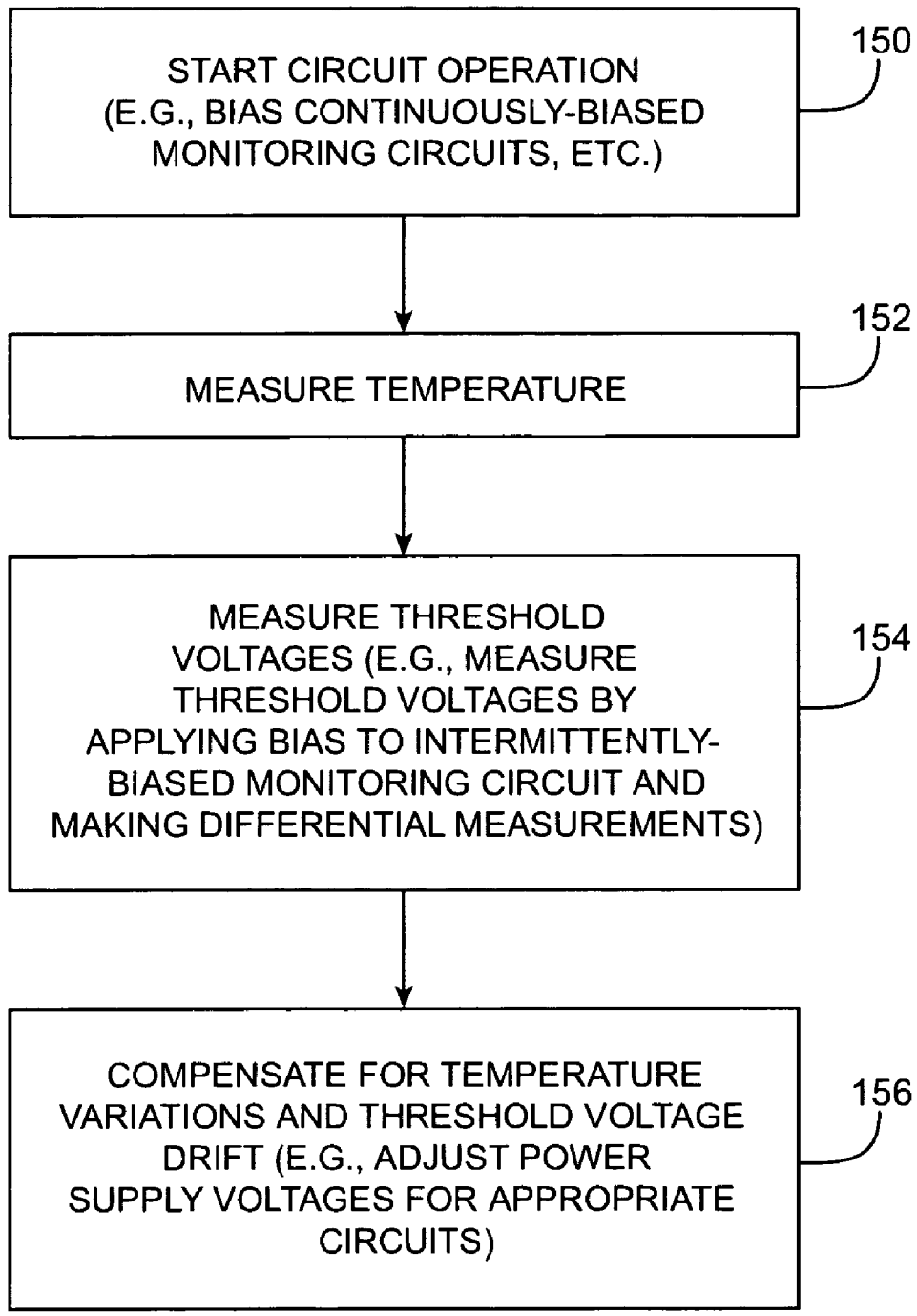
FIG. 18 is a flow chart of illustrative steps involved in using monitoring and compensation circuitry to compensate for the effects of temperature changes and threshold voltage drift on the operation of circuitry on a CMOS integrated circuit in accordance with the present invention.

Illustrative steps involved in using monitoring and compensation circuitry 34 to stabilize the operation of CMOS integrated circuit 32 are shown in FIG. 18. At step 150, the circuit 32 may be installed in a system and used to perform a desired operation. Whenever the circuit 32 is powered, continuously-biased circuits such as circuit 122 of FIG. 11 may be biased to ensure that the threshold voltages in its transistors will increase by an amount that is commensurate with the expected threshold voltage increases of similarly-biased transistors being used in the normal active circuitry of circuit 32. Circuits such as circuit 124 of FIG. 11 need only be biased intermittently (i.e., during a measurement).

At step 152, monitoring and compensation circuitry 34 may use temperature monitoring circuit 88 (FIG. 10) to measure the operating temperature of circuit 32. The threshold voltages of the transistors on circuit 32 may be measured at step 154. During step 154, the monitoring and compensation circuitry may, if desired, use a differential threshold voltage measurement by comparing the measured threshold voltage for transistors that have been continuously biased with the measured threshold voltage for transistor that have been intermittently biased.

The measurements made during steps such as steps 152 and 154 may be processed and used to stabilize the operation of integrated circuit 32 using real-time adjustments at step 156. In particular, monitoring and compensation circuit 34 may make power supply adjustments (e.g., adjustments to Vcc') that compensate for the monitored temperature and/or threshold voltage variations. The adjustments may involve increasing or otherwise changing the power supply voltage with time to stabilize a sensitive circuit such as a phase-locked loop circuit, delay-locked-loop circuit, or other suitable circuitry. The measurements of steps 152 and 154 may be made simultaneously or in sequence. Moreover, the measurements of steps 152 and 154 and the compensation of step 156 may be made at any suitable frequency. For example, temperature measurements may be made once per minute, threshold voltage-measurements may be made once per day, and suitable compensating adjustments to Vcc' may be made once per minute. These are merely illustrative frequencies with which these measurements and adjustments may be made. Any suitable measurement and adjustment frequency may be used if desired.

These stabilization arrangements may be used with any suitable type of integrated circuit such as a programmable logic device, a microprocessor, a digital signal processor, an application-specific integrated circuit, etc.

The foregoing is merely illustrative of the principles of this invention and various modifications can be made by those skilled in the art without departing from the scope and spirit of the invention.

What is claimed is:

1. An integrated circuit comprising:
   a circuit that has metal-oxide-semiconductor transistors with threshold voltages that change with age and that is powered by a power supply voltage; and
   monitoring and compensation circuitry that measures the threshold voltage changes and that compensates for the threshold voltage changes by adjusting the power supply voltage.

2. The integrated circuit defined in claim 1 wherein the monitoring and compensation circuitry comprises a continuously-biased threshold voltage monitoring circuit and an intermittently-biased threshold voltage monitoring circuit that are used to make differential measurements of the threshold voltage changes.

3. The integrated circuit defined in claim 1 wherein the monitoring and compensation circuitry further comprises temperature monitoring circuitry for monitoring temperature on the integrated circuit and wherein the monitoring and compensation circuitry adjusts the power supply voltage in real time to compensate for both the threshold voltage changes and changes in temperature.

4. The integrated circuit defined in claim 1 wherein the monitoring and compensation circuitry comprises:
   a threshold voltage monitoring circuit;
   an analog-to-digital converter that digitizes signals from the threshold voltage monitoring circuit to measure the threshold voltage changes;
   a control unit; and
   a digital-to-analog converter that the control unit uses to adjust the power supply voltage based on the threshold voltage changes measured using the analog-to-digital converter.

5. The integrated circuit defined in claim 1 wherein the monitoring and compensation circuitry further comprises temperature monitoring circuitry having an adjustable current source and a diode.

6. The integrated circuit defined in claim 1 further comprising a threshold voltage monitoring circuit having at least one continuously-biased transistor and at least one intermittently-biased transistor, wherein the threshold voltage monitoring circuit is used to make measurements of the threshold voltage changes by comparing threshold voltages measurements for the continuously-biased transistor with threshold voltage measurements for the intermittently-biased transistor.

7. The integrated circuit defined in claim 1 comprising:
   a continuously-biased threshold voltage monitoring circuit having at least one continuously-biased transistor;
   an intermittently-biased threshold voltage monitoring circuit having at least one intermittently-biased transistor;
   a multiplexer having respective inputs connected to the continuously-biased threshold voltage monitoring circuit and the intermittently-biased threshold voltage monitoring circuit and having an output; and
   an analog-to-digital converter that digitizes signals from the output of the multiplexer, wherein the multiplexer and analog-to-digital converter are used to make measurements of the threshold voltage changes by comparing threshold voltages measurements from the continuously-biased transistor with threshold voltage measurements from the intermittently-biased transistor.

8. The integrated circuit defined in claim 1 wherein the circuit that has the metal-oxide-semiconductor transistors comprises n-channel and p-channel metal-oxide-semiconductor transistors having threshold voltages that increase with age due to negative bias temperature instability and gate-oxide charge trapping and wherein the monitoring and compensation circuitry produces a positive power supply voltage Vcc' that increases with age to compensate for the effects of the increased threshold voltages of the n-channel and p-channel metal-oxide-semiconductor transistors.

9. The integrated circuit defined in claim 1 wherein the circuit that has the metal-oxide-semiconductor transistors comprises a voltage-controlled oscillator.

10. The integrated circuit defined in claim 1 wherein the monitoring and compensation circuitry comprises:
    a threshold voltage monitoring circuit that measures the threshold voltage;
    a temperature monitoring circuit that monitors temperature on the integrated circuit;
    a multiplexer having respective inputs connected to the threshold voltage monitoring circuit and temperature monitoring circuit and having an output; and
    an analog-to-digital converter that digitizes signals from the output of the multiplexer, wherein the digitized signals are used in adjusting the power supply voltage to compensate for the threshold voltage changes and changes in temperature.

11. A method for compensating an integrated circuit having metal-oxide-semiconductor transistors with threshold voltages for threshold voltage changes due to age, comprising:
    monitoring the threshold voltage changes; and
    adjusting at least one power supply voltage on the integrated circuit to compensate for the threshold voltage changes.

12. The method defined in claim 11 wherein:
    the metal-oxide-semiconductor transistor threshold voltages increase with age;
    the metal-oxide-semiconductor transistors are used in a circuit that is powered by the power supply voltage; and
    adjusting the power supply voltage comprises increasing the power supply voltage to compensate for the threshold voltage changes.

13. The method defined in claim 11 wherein monitoring the threshold voltage changes comprises continuously biasing at least one transistor in a continuously-biased monitoring circuit and intermittently biasing at least one transistor in an intermittently-biased monitoring circuit.

14. The method defined in claim 11 wherein monitoring the threshold voltage change comprises comparing at least some threshold voltage measurements to baseline threshold voltage measurements made on the integrated circuit.

15. The method defined in claim 11 wherein the metal-oxide-semiconductor transistors comprise n-channel metal-oxide-semiconductor transistors having a threshold voltage Vtn and p-channel metal-oxide-semiconductor transistors having a threshold voltage Vtp, wherein Vtn increases with time by an amount ΔVtn due to gate-oxide charge trapping and wherein Vtp increases with time by an amount ΔVtp due to negative bias temperature instability, wherein the power supply voltage is a positive power supply voltage Vcc', and wherein adjusting the power supply voltage comprises increasing Vcc' with time by an amount equal to ΔVtn plus ΔVtp.

16. The method defined in claim 11 wherein the integrated circuit comprises a phase-locked-loop circuit and wherein adjusting the power supply voltage to compensate for the threshold voltage changes comprises increasing the power supply voltage with time to stabilize the phase-locked-loop circuit.

17. The method defined in claim 11 wherein the integrated circuit comprises a delay-locked-loop circuit and wherein adjusting the power supply voltage to compensate for the threshold voltage changes comprises increasing the power supply voltage with time to stabilize the delay-locked-loop circuit.

18. The method defined in claim 11 wherein the metal-oxide-semiconductor transistor threshold voltages increase with age and the metal-oxide-semiconductor transistors are used in a circuit that is powered by the power supply voltage, the method further comprising making temperature measurements on the integrated circuit, wherein adjusting the power supply voltage comprises adjusting the power supply voltage to compensate for the threshold voltage changes and temperature changes.

19. The method defined in claim 11 further comprising:
making temperature measurements on the integrated circuit; and
adjusting the power supply voltage based on the temperature measurements to compensate for effects due to temperature changes.

20. The method defined in claim 19 further comprising using an adjustable current source and a diode to make the temperature measurements.

* * * * *